United States Patent [19]

Huang

[11] 4,219,797
[45] Aug. 26, 1980

[54] INTEGRATED CIRCUIT RESISTANCE LADDER HAVING CURVILINEAR CONNECTING SEGMENTS

[75] Inventor: Jen-yen Huang, San Jose, Calif.

[73] Assignee: National Semiconductor Corporation, Santa Clara, Calif.

[21] Appl. No.: 21,484

[22] Filed: Mar. 19, 1979

[51] Int. Cl.² ............................................. H01C 7/00
[52] U.S. Cl. ................................. 338/333; 338/308; 338/325; 357/51
[58] Field of Search ............................. 338/307–309, 338/322, 323, 325, 326, 333, 334; 357/51; 323/94 R; 29/610, 589

[56] References Cited

U.S. PATENT DOCUMENTS

| | | | |
|---|---|---|---|
| 3,460,026 | 8/1969 | Dow et al. | 338/305 X |
| 3,617,959 | 11/1971 | Cicero | 323/94 R X |
| 3,644,802 | 2/1972 | Dingwall | 357/51 |
| 3,922,707 | 11/1975 | Freed et al. | 357/51 X |
| 4,116,102 | 9/1978 | Tsunoo et al. | 357/51 X |

Primary Examiner—C. L. Albritton
Attorney, Agent, or Firm—Brown & Martin

[57] ABSTRACT

A resistance ladder having a plurality of resistance branches in an integrated circuit chip, including a layer of resistive material defining a plurality of discrete linear segments and a plurality of connector tabs extending from each of the linear segments at predetermined intervals for defining each resistance branch: wherein the layer of resistive material further defines a number of curvilinear segments for connecting the linear segments to provide a continuous resistive material layer for defining said resistance ladder. Each curvilinear segment is approximately a segment of a circle. The resistive material layer also defines a plurality of connector tabs extending from each curvilinear segment; with the angular separation of the tabs being approximately defined by $$\theta = (R/\rho)\ln(r_2/r_1),$$

wherein R is the resistance required for each leg of the resistance ladder;
$\rho$ is the sheet resistance of the resistive material;
$r_1$ is the inner radius of said circle; and
$r_2$ is the outer radius of said circle.

6 Claims, 1 Drawing Figure

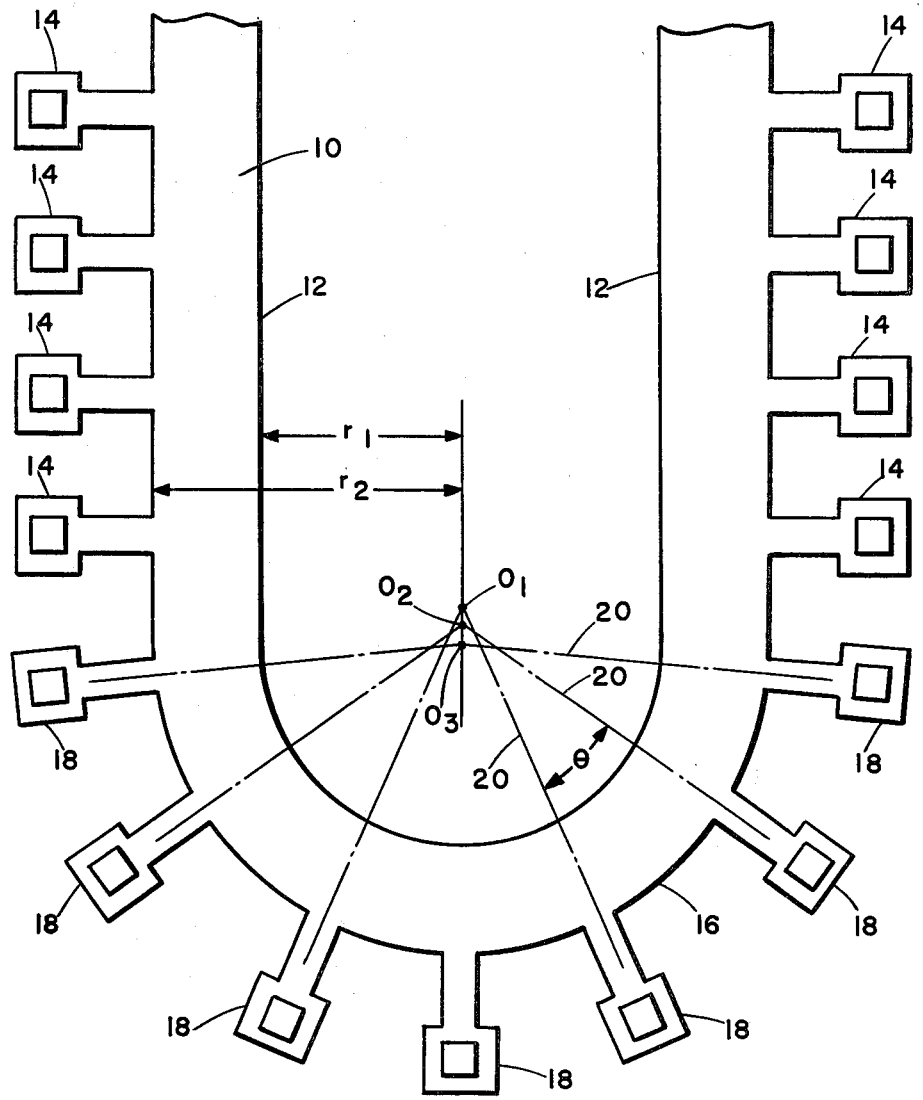

INTEGRATED CIRCUIT RESISTANCE LADDER HAVING CURVILINEAR CONNECTING SEGMENTS

BACKGROUND OF THE INVENTION

The present invention pertains to an improvement in an integrated circuit resistance ladder.

Resistance ladders typically are used in digital-to-analog (D/A) converters and in analog-to-digital (A/D) converters. Many resistance ladders include a long series of resistances for example, a series of 256 resistances is quite common.

When the D/A and A/D converters are embodied in integrated circuits, it is necessary to construct the resistance ladders within very small areas. The dimensional restrictions on the available area and die size limitations typically necessitate the resistance ladder being broken up into a plurality of linear segments which are connected in series. Each linear segment is defined in an integrated circuit chip by a layer of resistive material diffused in a semiconductor substrate. A plurality of connector tabs extend from each of the linear segments at predetermined intervals for defining the resistance branches within each linear segment. The linear segments of the resistive material are connected together by metallic contacts, which are deposited on the semiconductor substrate. Because the metallic contacts are deposited in a processing step that is performed separately from the processing step of diffusing the linear segments of resistive material, errors in alignment sometimes occur. Also there are variations in the contact resistance between the metallic contacts and the resistive layer, thereby introducing errors into the resistance ladder.

SUMMARY OF THE INVENTION

Th present invention eliminates errors within the resistance ladder caused by misalignment of contacts and by variations in contact resistance. The present invention is a resistance ladder having a plurality of resistance branches in an integrated circuit chip, including a layer of resistive material defining a plurality of discrete linear segments and a plurality of connector tabs extending from each of the linear segments at predetermined intervals for defining each resistance branch; characterized by the layer of resistive material further defining a number of curvilinear segments for connecting the linear segments to provide a continuous resistive material layer for defining the resistive ladder.

Curvilinear segments are essential for connecting the linear segments. If linear segments were to be used for interconnecting other linear segments, current crowding would occur in the corners formed at the junctures of such linear segments and errors thereby would be induced in the resistance ladder.

In the preferred embodiment of the resistance ladder of the present invention, each curvilinear segment is approximately a segment of a circle. When the linear segments are parallel to each other, each curvilinear segment is U-shaped. In the preferred embodiment, wherein the resistive material layer defines a plurality of connector tabs extending from each curvilinear segment; the resistance ladder is characterized by the angular separation of the tabs being approximately defined by $$\theta = (R/\rho)\ln(r_2/r_1),$$

wherein R is the resistance required for each leg of the resistance ladder; $\rho$ is the sheet resistance of the resistance material; $r_1$ is the inner radius of said circle; and $r_2$ is the outer radius of said circle.

BRIEF DESCRIPTION OF THE DRAWING

The FIGURE of the Drawing is a plan view of a segment of an integrated circuit chip resistance ladder illustrating the present invention.

DESCRIPTION OF THE PREFERRED EMBODIMENT

A preferred embodiment of a resistance ladder having a plurality of resistance branches in an integrated circuit chip, according to the present invention includes a layer of resistive material 10 defining a plurality of discrete linear segments 12 and a plurality of connector tabs 14 extending from each of the linear segments 12 at predetermined intervals for defining each resistance branch.

The layer of resistive material 10 further defines a curvilinear segment 16 for connecting the linear segments 12 to provide a continuous resistive material layer 10 for defining the resistance ladder. The linear segments 12 are parallel to each other, and the curvilinear segment 16 is U-shaped. The curvilinear segment 16 is approximately a segment of a circle.

The resistive material layer 10 further defines a plurality of connector tabs 18 extending from the curvilinear segment 16. The angular separation $\theta$ of the tabs 18 is approximately defined by $$\theta = (R/\rho)\ln(r_2/r_1),$$

wherein R is the resistance required for each leg of the resistance ladder; $\rho$ is the sheet resistance of the resistive material; $r_1$ is the inner radius of said circle; and $r_2$ is the outer radius of said circle.

However, in plotting the angles of separation in accordance with the foregoing formula, the loci $0_1$, $0_2$, $0_3$ from which the rays 20 are drawn to the tabs 18 for defining the boundaries of the angles $\theta$, are separately positioned as shown in the Drawing.

The connector tabs 14 are formed in accordance with the teaching of the applicant's co-pending application entitled "Resistor Termination", Ser. No. 947,667, filed Oct. 27, 1978, the disclosure of which is incorporated herein by reference.

I claim:

1. A resistance ladder having a plurality of resistance branches in an integrated circuit chip, comprising
   a layer of resistance material defining a plurality of discrete linear segments and a plurality of connector tabs extending from each of the linear segments at predetermined intervals for defining each resistance branch;
   wherein the improvement comprises:
   the layer of resistive material further defining a number of curvilinear segments for connecting the linear segments to provide a continuous resistive material layer for defining said resistance ladder.

2. The resistance ladder of claim 1, wherein the linear segments are parallel and each curvilinear segment is U-shaped.

3. The resistance ladder of claim 2, wherein each curvilinear segment is approximately a segment of a circle.

4. The resistance ladder of claim 3, wherein the resistive material layer defines a plurality of connector tabs extending from each curvilinear segment; characterized by the angular separation of the tabs being approximately defined by $$\theta = (R/\rho)\ln(r_2/r_1),$$

wherein R is the resistance required for each leg of the resistance ladder;
$\rho$ is the sheet resistance of the resistive material;
$r_1$ is the inner radius of said circle; and
$r_2$ is the outer radius of said circle.

5. The resistance ladder of claim 1, wherein each curvilinear segment is approximately a segment of a circle.

6. The resistance ladder of claim 5, wherein the resistive material layer defines a plurality of connector tabs extending from each curvilinear segment; characterized by the angular separation of the tabs being approximately defined by $$\theta = (R/\rho)\ln(r_2/r_1),$$

wherein R is the resistance required for each leg of the resistance ladder;
$\rho$ is the sheet resistance of the resistive material;
$r_1$ is the inner radius of said circle; and
$r_2$ is the outer radius of said circle.

* * * * *